(12) United States Patent
Eisele

(10) Patent No.: US 6,808,676 B1
(45) Date of Patent: Oct. 26, 2004

(54) METHOD AND DEVICE FOR PRODUCING SHAPED CERAMIC BODIES USING SETTER PLATES

(75) Inventor: Ulrich Eisele, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/830,068

(22) PCT Filed: Oct. 5, 1999

(86) PCT No.: PCT/DE99/03198

§ 371 (c)(1),
(2), (4) Date: Jul. 23, 2001

(87) PCT Pub. No.: WO00/24051

PCT Pub. Date: Apr. 27, 2000

(30) Foreign Application Priority Data

Oct. 21, 1998  (DE) .......................................... 198 48 474

(51) Int. Cl.$^7$ .......................... C04B 33/32; C03B 29/00; F27D 5/00
(52) U.S. Cl. ........................ 264/607; 264/608; 264/671; 156/89.16; 432/258; 432/259
(58) Field of Search ................................. 264/607, 608, 264/671, 614, 618, 619; 156/89.16; 432/258, 259

(56) References Cited

U.S. PATENT DOCUMENTS 4,474,731 A * 10/1984 Brownlow et al. ............ 419/5
4,971,738 A * 11/1990 Herron et al. ........... 156/89.18
5,277,723 A    1/1994 Kodama et al.
6,447,712 B1 * 9/2002 Dogan et al. ................ 264/608

FOREIGN PATENT DOCUMENTS

| DE | 43 09 005 | 1/1994 |
| EP | 0 120 243 | 10/1984 |
| EP | 0 352 211 | 1/1990 |
| EP | 0 493 879 | 7/1992 |

* cited by examiner

Primary Examiner—Christopher A. Fiorilla
(74) Attorney, Agent, or Firm—Kenyon & Kenyon

(57) ABSTRACT

A method and device for producing shaped ceramic bodies, particularly ceramic sheets or multilayer hybrids provided with printed circuit traces, switching elements and/or plated-through holes. The shaped ceramic bodies are initially present as green bodies and also contain organic auxiliary agents, for example as a binder. During sintering and/or removal of the binder from the shaped ceramic bodies, they are compressed between porous setter plates in whose pores a catalytically active substance is introduced, so that the gaseous, organic, bake-out products of the green bodies, these products developing during sintering and/or binder removal, are catalytically converted when escaping through the porous setter plates. The setter plates be provided with separating layers that likewise may contain the catalytically active substance. The method should provide a considerable time savings when sintering and/or removing binder from the shaped ceramic bodies.

34 Claims, 1 Drawing Sheet

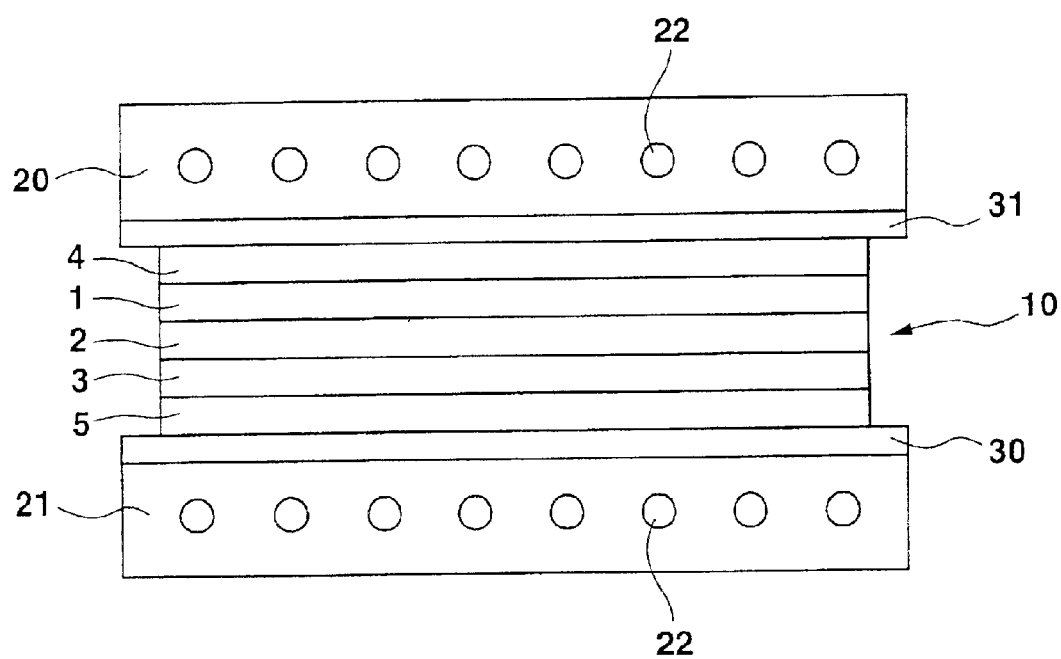

000# METHOD AND DEVICE FOR PRODUCING SHAPED CERAMIC BODIES USING SETTER PLATES

This application is a 371 of PCT/DE99/03198 filed Oct. 5, 1999.

FIELD OF THE INVENTION

The present invention relates to a method and a device for producing shaped ceramic bodies.

BACKGROUND INFORMATION

In German Published Patent Application No. 43 09 005 is discussed a method for producing multilayer hybrids from a plurality of ceramic green sheets which contain organic auxiliary agents as binders and sintering aids, and which are provided with printed circuit traces and plated-through holes. The stack of green sheets is pressed together by two porous, ceramic setter plates during sintering and removal of the binder, to ensure the least possible shrinkage and buckling within the green sheets. To achieve a simple separation between the setter plates and the multilayer hybrid after the sintering process, the setter plates are provided with a porous separating layer made, for example, of aluminum oxide which can be applied by slip casting or silk-screen printing. The organic auxiliary agents in the form of the binder or sintering additive are largely pyrolyzed during the binder removal or sintering, for example, in a hot press under axial pressure, and escape as organic bake-out products. In this context, the escape takes place, in part, via the porous setter plates or the applied porous separating layers which are gas-permeable. Damage to the ceramic sheets may result from burning out the organic auxiliary agents too quickly. Damage may result from the diffusion of the broken-up, split-off or partially-burned organic bake-out products through the setter plates. It is believed that there is a maximum portion of hydrocarbons in the oven atmosphere (to remain below the explosion limiting values) determine the speed for the duration of the binder removal and sintering process.

SUMMARY OF THE INVENTION

An object of an exemplary method of the present invention is to provide a method in which the necessary period of time for the sintering and removal of binder from the shaped ceramic bodies is markedly shortened, without, for example, exceeding the explosion limiting values in the oven atmosphere.

It is believed that the exemplary method of the present invention has the advantage that, by introducing a catalytically active substance into the pores of the porous setter plates and/or into the pores of the porous separating layers, a catalytic conversion of the gaseous bake-out products that escape when baking out the green bodies is at least partially achieved. The bake-out products are, in one exemplary embodiment, decomposition products of the organic auxiliary agents and contain hydrocarbons, among other things.

The escaping bake-out products are, in an exemplary embodiment, converted into less combustible or incombustible gases. In this manner, an exemplary method of the present invention may be used to bake out more organic auxiliary agents per unit of time than previously, without, for example, the explosion limiting values for hydrocarbons being reached in the oven atmosphere. It is believed that this results in a considerable time savings during the sintering and/or removal of the binder from the green bodies, and thus to a shortening of the oven cycles, which should mean a marked cost reduction and a substantially lower need for investment in oven installations.

Moreover, it is believed that catalytically converted, low-molecular oxidation or bake-out products diffuse more quickly through the porous setter plates and the optionally provided separating layers than unconverted, high-molecular bake-out products, which may mean a further time savings during production. According to one exemplary method and/or device of the present invention, installations for the catalytic afterburning of the waste gases carried away from the ceramic green bodies via the setter plates may be smaller.

According to one exemplary embodiment of the present invention, in addition to being introduced into the porous setter plates, the catalytically active substance may also be introduced into the porous separating layers, which is believed to bring with it advantages from the standpoint of process engineering. In an alternative exemplary embodiment, given an appropriate activity of the introduced, catalytically active substance, it may even be sufficient if the substance is only in the porous separating layers, which should lead to a markedly reduced need for these sometimes expensive materials. In the same way, for some purposes it may be sufficient if the catalytically active substance is merely introduced into the surface area of the porous setter plates or separating layers, for example, by spraying on or impregnating. This may also reduce material costs.

Thus, in one exemplary method according to the present invention, starting materials may be used which, in the course of a thermal after-treatment of the setter plates and/or the separating layers, respectively, are converted to form metallic, nano-scale particles in the pores of the setter plates and/or the separating layers.

Another exemplary embodiment involves the selection of a metallic-salt solution as the starting material for introducing the catalytically active substance. In this exemplary embodiment there may be no unwanted, in particular inorganic, residues remaining in the setter plates and/or separating layers after the thermal after-treatment.

For faster removal of gaseous bake-out and conversion products, it is believed that the setter plates may be provided with additional gas outlets arranged, in particular, parallel to the surface of the setter plates.

BRIEF DESCRIPTION OF THE DRAWING

The FIGURE shows a ceramic multilayer hybrid composed of a stack of ceramic sheets between two porous setter plates which are separated from the stack of sheets by porous separating layers.

DETAILED DESCRIPTION

A shaped ceramic body, which, for example, can be one ceramic sheet, a stack of ceramic sheets or a ceramic multilayer hybrid 10 composed of ceramic sheets 1, 2, 3, 4, 5, and which is provided with printed circuit traces, switching elements arid plated-through holes (not shown in the FIGURE), is situated between two porous setter plates 20, 21. The two porous setter plates 20, 21 may, on the surface on the side facing multilayer hybrid 10, be provided with porous separating layers 30, 31. Setter plates 20, 21 may be provided with gas outlets 22, e.g. in the form of channels running parallel to the surface of the plates, for more rapid removal of escaping gases. The shaped ceramic body (that is, multilayer hybrid 10) may exist initially as a green body and, in addition to ceramic components, may also contain organic auxiliary agents, e.g. in the form of binders, sintering additives, softeners and residues of solvents.

Setter plates 20, 21 may be made of porous, ceramic materials and may be gas-permeable for organic bake-out products which develop during binder removal and/or sintering of the shaped ceramic bodies. They may be preferably gas-permeable for low-molecular, gaseous oxidation products such as CO, $CO_2$, $H_2O$, $CH_4$, as well as simple hydrocarbons.

The process of sintering and/or removing binder from multilayer hybrid 10 is carried out in a hoc press under axial pressure, setter plates 20, 21 in particular may prevent sintering shrinkage of multilayer hybrid 10 from occurring in the plane of setter plates 20, 21. Since, because of their fragility, it is very difficult to handle multilayer hybrids 10 from which the binder has been removed, the entire binder removal and sintering process must be carried out in the hot press, although "typically" less than one hour of 11.5 hr. of firing time is necessary for the actual sintering under pressure. Essentially, the removal of binder from multilayer hybrid 10 by gradual bake-out is carried out during the remaining time, as a result of which the organic auxiliary agents are thermally decomposed to a great extent, or volatize, undecomposed, from the green body and are carried away to the outside through the gas-permeable setter plates. Thus, essentially, the time for the diffusion of the cracked or partially-burned, organic constituents through setter plates 20, 21 is speed-determinate for the binder removal process. Since the organic constituents contain a high portion of hydrocarbon compounds, for reasons of operational safety (protection against explosion), the binder removal process must be carried out so that the concentration of hydrocarbons in the oven atmosphere always remains below the explosion limiting values.

Porous separating layers 30, 31 simplify the removal of ready-sintered multilayer hybrid 10 from setter plates 20, 21. For example, the separating layers contain essentially ceramic constituents such as aluminum oxide and are preferably applied on setter plates 20, 21 by silk-screen printing or slip casting. The exemplary method of the present invention, however, can also be implemented without separating layers 30, 31. Porous separating layers 30, 31, like setter plates 20, 21, are gas-permeable for organic bake-out products from the ceramic green body.

One aspect of the exemplary method and/or device of the present invention is the introduction of a catalytically active substance into setter plates 20, 21 and/or separating layers 30, 31 prior to beginning the actual process of sintering and/or removal of binder from the shaped ceramic bodies, in order to accelerate the implementation of this binder removal process.

Catalytically active noble metals such as palladium, rhodium or platinum are believed to be suitable for this purpose. The specific selection of the catalytically active substance in the individual case is made according to the type of the organic auxiliary agents and their quantity, as well as the sintering or binder-removal temperatures utilized, it always being important and/or necessary to take into account the catalytic activity of the respective material and its costs. The catalytically active substance is used specifically to catalytically convert organic auxiliary agents escaping from the green body during sintering and/or binder removal. To that end, it is believed to be very advantageous if it is located in the pores of the porous materials of setter plates 20, 21 and/or of porous separating layers 30, 31, where it is easily available for the escaping gases and can develop a suitably high activity. The catalytically active substance catalytically converts the organic hydrocarbon compounds contained in the escaping bake-out products by, for example, oxidizing them or converting high-molecular, organic hydrocarbon compounds to form low-molecular hydrocarbon compounds. In particular, it is used for the oxidation of easily combustible hydrocarbons into incombustible or non-explosive compounds which are then removed via the pores in setter plates 20, 21 and/or separating layers 30, 31, as well as via gas outlets 22.

The catalytically active substance can be introduced into setter plates 20, 21 and separating layers 30, 31, respectively, by dipping setter plates 20, 21 into an appropriate metallic-salt solution, or by spraying the surface area of setter plates 20, 21 with this solution. In this context, setter plates 20, 21 can already have been provided with separating layers 30, 31 beforehand, so that the catalytically active substance is also introduced into separating layers 30, 31.

By dipping, the catalytically active substance is distributed essentially uniformly within setter plates 20, 21, and optionally within separating layers 30, 31, as well. By spraying in particular the side of the porous plates facing the ceramic green body, the catalytically active substance is present largely on the surface on setter plates 20, 21 and separating layers 30, 31, respectively. Spraying has the advantage that the quantity of catalytically active material used up is relatively small, which means lower material costs. On the other hand, because of the distribution on the surface, only a small part of the volume of setter plates 20, 21 is catalytically active, which means a correspondingly longer or less complete catalytic conversion of the organic bake-out products.

In further exemplary embodiments, the catalytically active substance is introduced only into separating layers 30, 31, for example, by subsequent spraying. In this case again, it would be important and/or necessary in the individual case to weigh advantages and disadvantages from the standpoint of process engineering against material costs and the time savings attained during the binder removal.

To ensure a homogenous and very fine distribution of the catalytically active substance in setter plates 20, 21 and separating layers 30, 31, respectively, or in the corresponding surfaces, they are in an exemplary embodiment steeped in an aqueous metallic-salt solution containing at least one of the metallic salts $PtCl_6$, $PdCl_2$, $RhCl_3$, platinum acetate, rhodium acetate or palladium acetate. The concentration of the catalytically active substance in this metallic-salt solution may be between 0.1 g/l to 30 g/l. Concentrations of 1 g/l to 15 g/l have turned out to be particularly advantageous. In this case, in a setter plate 20 weighing 1 kg, when using a platinum solution containing 10 g of platinum to 1 liter of solution, approximately 0.6 g of platinum is introduced into setter plate 20. When using a solution containing 6 g of palladium to 1 liter of solution, approximately 0.4 g of palladium is introduced per plate.

After setter plates 20, 21 have been sprayed or dipped, a thermal after-treatment of setter plates 20, 21 with the introduced catalytically active substance is expediently carried out. Depending on the size of the plates, the type of metal introduced and the metallic-salt solution employed, this after-treatment lasts from 30 minutes to 5 hours at a temperature of 100° C. to 700° C. This may be carried out in a gas atmosphere, such as air or nitrogen, which does not oxidize the catalytically active substance. However, when working with a few catalytically active materials which can be oxidized relatively easily, in order to avoid oxidation, it is believed to be best if work is carried out in a reductive gas atmosphere. For example, in the case of platinum, rhodium and palladium, it is sufficient if the thermal after-treatment is carried out at 500° C. over 2 hr. in air.

The use of organic metallic compounds, such as the acetates indicated, is particularly recommendable for applications in which no residues of the introduced metallic-salt solution are to remain in setter plates 20, 21 and separating layers 30, 31 after the thermal after-treatment, since these compounds thermally decompose in a substantially residue-free manner during the thermal after-treatment.

In another exemplary embodiment, the catalytically active substance is present in the form of uniformly distributed, nano-scale, metallic colloids of, for example, platinum, rhodium or palladium in the pores of the porous setter plates and separating layers, respectively. It is believed that the size of these colloids is advantageously between 3 nm and 100 nm, in order to attain the highest possible specific surface areas, and thus an effective seeding of setter plates 20, 21 or of separating layers 30, 31.

What is claimed is:

1. A method for producing a formed body, the formed body including at least one of a formed ceramic body, a ceramic sheet and a multilayer hybrid, the formed body having at least one of a printed circuit trace, a switching element and a plated throughhole, the method comprising the steps of:

disposing a plurality of green bodies containing an organic auxiliary agent between porous setter plates, through which a gaseous, organic, bake-out product escapes from the plurality of green bodies developed during at least one of a sintering operation and a binder removal operation, the step of disposing being performed during at least one of the sintering operation and the binder removal operation; and introducing a catalytically active substance into pores of at least one of the porous setter plates, the catalytically active substance converting the gaseous, organic, bake-out product into relatively less combustible compounds.

2. The method of claim 1, wherein the catalytically active substance oxidizes an organic hydrocarbon compound.

3. The method of claim 1, wherein the catalytically active substance converts a high-molecular, organic hydrocarbon compound to a low-molecular, organic hydrocarbon compound.

4. The method of claim 1, wherein the catalytically active substance includes at least one of platinum, palladium and rhodium.

5. The method of claim 1, wherein the catalytically active substance is in a form of colloids, the colloids having sizes of 3 nm to 100 nm.

6. The method of claim 1, wherein the formed body is a ceramic multilayer hybrid, and the plurality of green bodies includes a stack of a plurality of green sheets arranged in a justified manner one upon the other and provided with at least one of the printed circuit trace, the switching element and the plated-through hole.

7. The method of claim 1, wherein the catalytically active substance is introduced into the pores of the at least one of the porous setter plates in the step of introducing.

8. A device for producing a formed body, the formed body including at least one of a formed ceramic body, a ceramic sheet and a multilayer hybrid, the formed body having at least one of a printed circuit trace, a switching element and a plated throughhole, the device comprising:

porous setter plates, a plurality of green bodies containing an organic auxiliary agent being disposable between the porous setter plates, through which a gaseous, organic, bake-out product escapes from the plurality of green bodies developed during at least one of a sintering operation and a binder removal operation;

wherein:
        a catalytically active substance is introduced into pores of at least one of the porous setter plates, the catalytically active substance converting the gaseous hydrocarbons into relatively less combustible compounds; and
        the porous setter plates include gas outlets.

9. A method for producing a formed body, the formed body including at least one of a formed ceramic body, a ceramic sheet and a multilayer hybrid, the formed body having at least one of a printed circuit trace, a switching element and a plated throughhole, the method comprising the steps of:

disposing a plurality of green bodies containing an organic auxiliary agent between porous setter plates, through which gaseous hydrocarbons escape from the plurality of green bodies developed during at least one of a sintering operation and a binder removal operation, the step of disposing being performed during at least one of the sintering operation and the binder removal operation; and introducing a catalytically active substance into pores of at least one of the porous setter plates, the catalytically active substance converting the gaseous hydrocarbons into relatively less combustible compounds.

10. The method according to claim 9, wherein the catalytically active substance oxidizes the gaseous hydrocarbon.

11. The method according to claim 9, wherein the catalytically active substance converts the gaseous hydrocarbon to a relatively lower-molecular weight hydrocarbon.

12. The method according to claim 9, wherein the catalytically active substance is a metallic-salt solution.

13. The method according to claim 9, wherein the catalytically active substance includes at least one of platinum, palladium and rhodium.

14. A method for producing a formed body, the formed body including at least one of a formed ceramic body, a ceramic sheet and a multilayer hybrid, the formed body having at least one of a printed circuit trace, a switching element and a plated throughhole, the method comprising the steps of:

disposing a plurality of green bodies containing an organic auxiliary agent between porous setter plates, through which gaseous hydrocarbons escape from the plurality of green bodies developed during at least one of a sintering operation and a binder removal operation, the step of disposing being performed during at least one of the sintering operation and the binder removal operation; and spraying a catalytically active substance onto the porous setter plates, the catalytically active substance converting the gaseous hydrocarbons into relatively less combustible compounds.

15. The method according to claim 14, wherein the catalytically active substance is a metallic-salt solution.

16. The method according to claim 14, wherein the catalytically active substance converts the gaseous hydrocarbon to a relatively lower-molecular weight hydrocarbon.

17. The method according to claim 14, wherein the catalytically active substance includes at least one of platinum, palladium and rhodium.

18. A method for producing a formed body, the formed body including at least one of a formed ceramic body, a ceramic sheet and a multilayer hybrid, the formed body having at least one of a printed circuit trace, a switching element and a plated throughhole, the method comprising the steps of:

disposing at least one porous separating layer on inner surfaces of porous setter plates;

disposing a plurality of green bodies containing an organic auxiliary agent between the porous setter plates, through which a gaseous, organic, bake-out product escapes from the plurality of green bodies developed during at least one of a sintering operation and a binder removal operation, the step of disposing being performed during at least one of the sintering operation and the binder removal operation; and introducing a catalytically active substance into pores of at least one porous separating layer of the porous setter plates, the catalytically active substance converting the gaseous, organic, bake-out product into relatively less combustible compounds.

19. The method of claim 18, wherein the catalytically active substance is introduced into the pores of the at least one porous separating layer in the step of introducing.

20. The method of claim 18, wherein the catalytically active substance is also introduced into pores of at least one of the porous setter plates.

21. The method of claim 18, wherein the catalytically active substance is at least one of introduced: (i) into a surface area of at least one of the porous setter plates and the at least one porous separating a layer; and (ii) uniformly inside at least one of the porous setter plates and the at least one porous separating layer.

22. The method of claim 18, further comprising the step of thermally treating at least one of (i) at least one of the porous setter plates and (ii) the at least one porous separating layer, after the step of introducing the catalytically active substance;

wherein the step of introducing the catalytically active substance is performed by at least one of steeping in a solution and spraying with the solution, the solution containing the catalytically active substance.

23. The method of claim 22, wherein the solution is a metallic-salt solution.

24. The method of claim 23, wherein the metallic-salt solution is an aqueous solution including at least one of PtCl6, PdCl2, RhCl3, platinum acetate, palladium acetate and rhodium acetate.

25. The method of claim 22, wherein the solution includes the catalytically active substance in a concentration of 0.1 g/l to 30 g/l.

26. The method of claim 22, wherein the step of thermally treating is performed in a gas atmosphere that at least one of (i) does not oxidize the catalytically active substance and (ii) reduces the catalytically active substance.

27. The method of claim 22, wherein the step of thermally treating is performed over a time period of 30 minutes to 5 hours at a temperature of 100 degrees Celsius to 700 degrees Celsius.

28. A device for producing a formed body, the formed body including at least one of a formed ceramic body, a ceramic sheet and a multilayer hybrid, the formed body having at least one of a printed circuit trace, a switching element and a plated throughhole, the device comprising:

porous setter plates having at least one porous separating layer disposed between them, a plurality of green bodies containing an organic auxiliary agent being disposable between the porous setter plates, through which a gaseous, organic, bake-out product escapes from the plurality of green bodies developed during at least one of a sintering operation and a binder removal operation;

wherein:
a catalytically active substance is introduced into pores of at least one porous separating layer of the porous setter plates, the catalytically active substance converting the gaseous hydrocarbons into relatively less combustible compounds; and the porous setter plates include gas outlets.

29. The device of claim 28, wherein the catalytically active substance is introduced to a porous arrangement, the porous arrangement including one of (i) at least two of the porous setter plates and (ii) at least two of the porous separating layers, the porous arrangement being for compressing the plurality of green bodies during the at least one of the sintering operation and the binder removal operation.

30. The device of claim 29, wherein the porous arrangement is permeable for at least one of a low-molecular, gaseous, oxidation product CO, CO2, H2O, CH4 and a hydrocarbon.

31. A method for producing a formed body, the formed body including at least one of a formed ceramic body, a ceramic sheet and a multilayer hybrid, the formed body having at least one of a printed circuit trace, a switching element and a plated throughhole, the method comprising the steps of:

disposing at least one porous separating layer on inner surfaces of porous setter plates;

disposing a plurality of green bodies containing an organic auxiliary agent between the porous setter plates, through which gaseous hydrocarbons escape from the plurality of green bodies developed during at least one of a sintering operation and a binder removal operation, the step of disposing being performed during at least one of the sintering operation and the binder removal operation; and introducing a catalytically active substance into pores of at least one porous separating layer of the porous setter plates, the catalytically active substance converting the gaseous hydrocarbons into relatively less combustible compounds.

32. The method according to claim 31, wherein the catalytically active substance is introduced in the introducing step by spraying the at least one of the porous setter plates and porous separating layer of the porous setter plates.

33. The method according to claim 31, wherein the catalytically active substance is introduced in the introducing step by steeping the at least one of the porous setter plates and porous separating layer of the porous setter plates.

34. A method for producing a formed body, the formed body including at least one of a formed ceramic body, a ceramic sheet and a multilayer hybrid, the formed body having at least one of a printed circuit trace, a switching element and a plated throughhole, the method comprising the steps of:

disposing at least at least one porous separating layer on inner surfaces of porous setter plates;

disposing a plurality of green bodies containing an organic auxiliary agent between the porous setter plates, through which gaseous hydrocarbons escape from the plurality of green bodies developed during at least one of a sintering operation and a binder removal operation, the step of disposing being performed during at least one of the sintering operation and the binder removal operation; and spraying a catalytically active substance onto at least one porous separating layer of the porous setter plates, the catalytically active substance converting the gaseous hydrocarbons into relatively less combustible compounds.

* * * * *

UNITED STATES PATENT AND TRADEMARK OFFICE
CERTIFICATE OF CORRECTION

PATENT NO. : 6,808,676 B1
DATED : October 26, 2004
INVENTOR(S) : Ulrich Eisele

It is certified that error appears in the above-identified patent and that said Letters Patent is hereby corrected as shown below:

Column 3,
Line 13, change "in a hoc press" to -- in a hot press --

Signed and Sealed this

Ninth Day of August, 2005

JON W. DUDAS
*Director of the United States Patent and Trademark Office*